US012699120B2

(12) United States Patent
Potlapalli et al.

(10) Patent No.: US 12,699,120 B2
(45) Date of Patent: Aug. 4, 2026

(54) SENSED CURRENT SCALING IN POWER CONVERTERS

(71) Applicant: Renesas Electronics America Inc., Milpitas, CA (US)

(72) Inventors: Yashovardhan Rao Potlapalli, Cary, NC (US); John Stuart Kleine, Cary, NC (US)

(73) Assignee: Renesas Electronics America Inc., Milpitas, CA (US)

( * ) Notice: Subject to any disclaimer, the term of this patent is extended or adjusted under 35 U.S.C. 154(b) by 211 days.

(21) Appl. No.: 18/592,899

(22) Filed: Mar. 1, 2024

(65) Prior Publication Data

US 2024/0295591 A1 Sep. 5, 2024

Related U.S. Application Data

(60) Provisional application No. 63/488,350, filed on Mar. 3, 2023.

(51) Int. Cl.
| | |
|---|---|
| *G01R 19/25* | (2006.01) |
| *G06F 1/32* | (2019.01) |
| *H02M 1/00* | (2007.01) |
| *H03M 1/00* | (2006.01) |
| *H03M 1/12* | (2006.01) |
| *H03M 1/66* | (2006.01) |

(52) U.S. Cl.
CPC ......... *G01R 19/2506* (2013.01); *G01R 19/25* (2013.01); *G01R 19/2513* (2013.01); *G06F 1/32* (2013.01); *H02M 1/0009* (2021.05); *H02M 1/0012* (2021.05); *H03M 1/12* (2013.01); *H03M 1/66* (2013.01); *H03M 1/001* (2013.01)

(58) Field of Classification Search
CPC ....................... G01R 19/2506; G01R 19/2513; G01R 19/25; H03M 1/001; H03M 1/12; H03M 1/66; H02M 1/0009; H02M 1/0012; G06F 1/32
See application file for complete search history.

(56) References Cited

U.S. PATENT DOCUMENTS 11,194,355 B2 * 12/2021 Kommaraju .............. G05F 1/12

* cited by examiner

*Primary Examiner* — Khai M Nguyen
(74) *Attorney, Agent, or Firm* — SCULLY, SCOTT, MURPHY & PRESSER, P.C.

(57) ABSTRACT
Systems and methods for power converters are described. A digital to analog converter (DAC) can be configured to receive a digital representation of a maximum current value of a power conversion system. The DAC can be further configured to convert the digital representation of the maximum current value into an analog current signal. An analog to digital converter (ADC) can be configured to generate, based on the analog current signal, a digital signal representing a sensed current of the power conversion system as a function of the maximum current value.

20 Claims, 5 Drawing Sheets

100 ➤

400

402
Receive a digital representation of a maximum current value of a power conversion system 404
Convert the digital representation of the maximum current value into an analog current signal 406
Generate, based on the analog current signal, a digital signal representing a sensed current of the power conversion system as a function of the maximum current value

SENSED CURRENT SCALING IN POWER CONVERTERS

CROSS-REFERENCE TO RELATED APPLICATION

This application is based upon and claims the benefit of priority under 35 U.S.C. 119 (e) to U.S. Patent Application No. 63/488,350 filed on Mar. 3, 2023, and titled SCALING SENSED CURRENT AS A FRACTION OF SYSTEM MAXIMUM WITHOUT DIGITAL DIVISION, the entire disclosure of which is incorporated herein by reference in its entirety.

BACKGROUND

Unless otherwise indicated herein, the materials described in this section are not prior art to the claims in this application and are not admitted to be prior art by inclusion in this section. The present disclosure relates in general to systems and methods of reporting monitored current in power converters.

Power converters or voltage converters, such as buck converters and boost converters, can be used for converting an input voltage to an output voltage having a different voltage level. A buck converter, or step-down converter, can convert the input voltage into a lower voltage. A boost converter, or step-up converter, can convert the input voltage into a higher voltage. A buck-boost converter can step up or step down the input voltage. A voltage converter can include multiple switches that can be turned on and off by a pulse width modulated (PWM) control signal. A duty cycle of the PWM control signal can define an output voltage of the voltage converter. When the voltage converter is connected to a load, the load can demand a specific amount of power by drawing a specific amount of current, and the voltage converter can perform the voltage conversion to generate the output voltage that can deliver the power demanded by the load. The current being drawn by the load can be sensed and fed back to a controller of the power converter, and the controller can report the sensed current to a host processor for the host processor to run various applications, such as optimizing performance of the load.

SUMMARY

In one embodiment, a semiconductor device in a power conversion system is generally described. The semiconductor device can include a digital to analog converter (DAC) and an analog to digital converter (ADC). The DAC can be configured to receive a digital representation of a maximum current value of a power conversion system. The DAC can be further configured to convert the digital representation of the maximum current value into an analog current signal. The ADC can be configured to generate, based on the analog current signal, a digital signal representing a sensed current of the power conversion system as a function of the maximum current value.

In one embodiment, a system that is a power conversion system is generally described. The system can include at least one power stage, a controller configured to control the power stage and a circuit. The circuit an include a digital to analog converter (DAC) configured to receive a digital representation of a maximum current value of the system. The DAC can be further configured to convert the digital representation of the maximum current value into an analog current signal. The circuit can further include an analog to digital converter (ADC) configured to generate, based on the analog current signal, a digital signal representing a sensed current of an inductor connected to an output of the power stage as a function of the maximum current value. The controller can be further configured to report the digital signal to a host processor.

In one embodiment, a method for operating a power conversion system is generally described. The method can include receiving a digital representation of a maximum current value of a power conversion system. The method can further include converting the digital representation of the maximum current value into an analog current signal. The method can further include generating, based on the analog current signal, a digital signal representing a sensed current of the power conversion system as a function of the maximum current value.

The foregoing summary is illustrative only and is not intended to be in any way limiting. In addition to the illustrative aspects, embodiments, and features described above, further aspects, embodiments, and features will become apparent by reference to the drawings and the following detailed description. In the drawings, like reference numbers indicate identical or functionally similar elements.

DETAILED DESCRIPTION

Figure 1A:
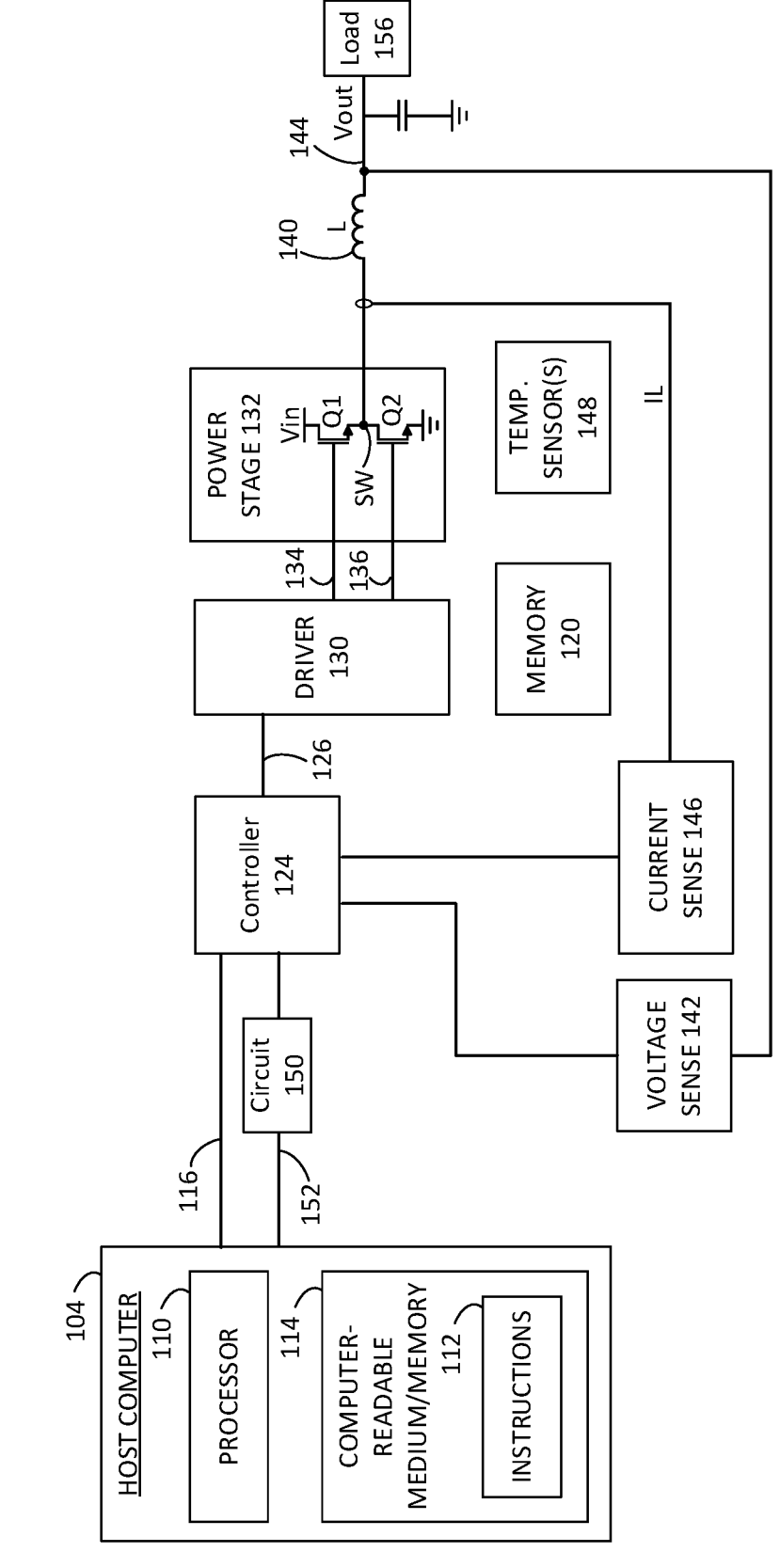
FIG. 1A illustrates an example of a system that can implement sensed current scaling in power converters in one embodiment.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

A power converter can include power devices, such as field-effect transistors (FETs), that can be switched to generate output voltages for supplying power to a load. A controller of the power converter can include modulators configured to generate pulse-width-modulation (PWM) signals. The power converter can also include driver circuits that can receive the PWM signals and generate voltage signals using the PWM signals. The driver circuits can drive the power devices by applying the voltage signals to the gate terminals of the power devices to switch the power devices on and off. In an aspect, input voltage being provided to the power converter can have a voltage that is higher than the voltage of the power being demanded by the load. The power converter, which can be a buck converter, can step down the input voltage to generate an output voltage that has a voltage level being demanded by the load.

In an aspect, a power converter can be connected to different loads that demand different levels of power. A heavy load can demand relatively more power and a light load can demand relatively less power. The power converter can be designed and configured to supply different levels of power to accommodate heavy and light loads. The switching of the power devices can be controlled for the power converter to supply different amount of power to different loads. In an aspect, if a power converter is designed and configured for light loads, then the power converter may not be able to supply heavy loads. If the power converter is designed and configured for heavy loads, then the power converter can supply both heavy and light loads since the power devices can be controlled in specific ways to generate lower voltage for the light loads.

For example, the power converter can include multiple phases, where a phase is a power stage (e.g., power FETs connected to an inductor). The multiple power stages can be connected in parallel to deliver different levels of power, and also high power for heavy loads, in a relatively efficient manner. The controller of the power converter can manage the number of active phases based on the load to make the power conversion as efficient as possible. For example, the controller can activate more phases to supply power to a heavy load, and an activate fewer phases, or even only one phase, to supply power to a light load. In an aspect, power converter that can supply both heavy and light loads can include power devices or power FETs that may have more power capability, such as being larger, having more power capacity, having higher voltage. Hence, the efficiency of such power converters may not be optimal when supplying light loads because the power devices with more power capabilities may require relatively more quiescent current to be powered up and switched.

To be described in more detail below, a power conversion system can include a power stage integrated in a power management integrated circuit (PMIC) and an external power stage that is outside of the PMIC. A controller can operate the power conversion system under a low power mode by switching power stage in the PMIC to supply power to light loads. The controller can also operate the power conversion system under a high power mode by switching external power stage to supply power to heavy loads. The controller can also switch between the high power mode and the low power mode in a seamless manner such that entry to and exit from the low power mode would not disturb operations of the power conversion system, removes between the high power mode and the low power mode, and protects the power stage in the PMIC from excessive power draw or destruction. In some examples, the power stage integrated in the PMIC for low power mode can be referred to as a baby phase.

FIG. 1A illustrates an example of a system that can implement sensed current scaling in power converters in one embodiment. System 100 in FIG. 1A can be a power converter system, according to a non-limiting example. As used herein, the terms block, module, circuit, system and the like may refer to various hardware, firmware, and software elements, or a combination thereof.

System 100 can include at least a host computer 104, a controller 124, a plurality of storage or memory locations 120 (e.g., addresses), a driver circuit (or driver) 130, a power stage 132 and other components such as voltage sense circuit 142, current sense circuit 146 and temperature sensors 148. Memory locations 120 can include, for example, configuration registers, control registers, and status registers to store instructions, configuration data, and retain status for communication with host computer 104. Controller 124 can include one or more semiconductor devices implementing, for example, a microcontroller including hardware such as various analog and digital circuit components. Controller 124 can include, for example, a processor, central processing unit (CPU), field-programmable gate array (FPGA) or any other circuitry that is configured to control and operate various aspects of power stage 132. Controller 124 be configured to control various aspects of system 100. Host computer 104 can be configured to provide control to and receive status from controller 124. In the embodiment shown in FIG. 1A, power stage 132 and controller 124 can be locate on different semiconductor chips.

Figure 1B:
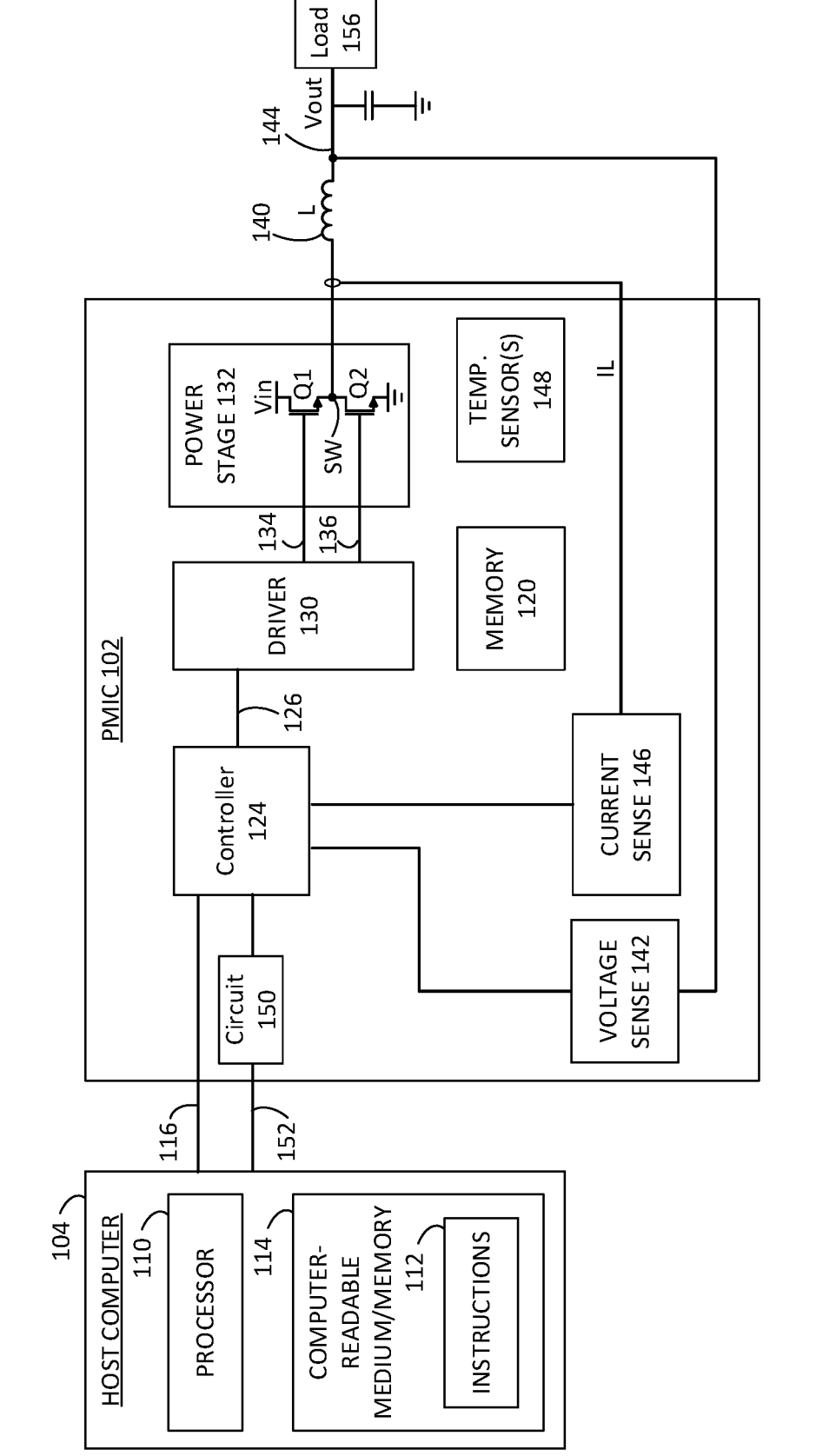
FIG. 1B illustrates another example of a system that can implement sensed current scaling in power converters in one embodiment.

FIG. 1B illustrates another example of a system that can implement sensed current scaling in power converters in one embodiment. System 180 in FIG. 1B can be a power converter system, according to a non-limiting example. As used herein, the terms block, module, circuit, system and the like may refer to various hardware, firmware, and software elements, or a combination thereof. System 180 can include at least a host computer 104 and a power management integrated circuit (PMIC) 102. PMIC 102 can include at least controller 124, memory locations 120 (e.g., addresses), driver 130, power stage 132 and other components such as voltage sense circuit 142, current sense circuit 146 and temperature sensors 148. In the embodiment shown in FIG. 1B, power stage 132 and controller 124 can be integrated in the same semiconductor chip, such as PMIC 102.

Controller 124, shown in both FIG. 1A and FIG. 1B, can be configured to execute instructions that may include firmware, software, and configuration data that may be embedded in or accessible by memory locations 120 or may be at least partially downloaded from host computer 104. Controller 124 can be further configured to generate control signals 126 (e.g., PWM signals) for turning on and turning off switches in power stage 132 and send control signals 126 to driver circuit 130. Driver circuit 130 can receive the control signals and convert the control signals into drive signals that can be gate voltages for driving switches in power stage 132. Controller 124 can be further configured to monitor various parameters relating to operations in system 100 and based on the monitored parameters, determine whether to operate system 100 under a high power mode or a low power mode to supply different levels of power to one or more loads, such as a load 156.

Power stage 132 can include at least a pair of switches Q1, Q2. Switches Q1, Q2 can be, for example, metal oxide field effect transistors (MOSFETS). Switch Q1 can be an N-type (e.g., N-channel) MOSFET arranged serially between an input voltage Vin1 and a switch node SW. In one embodiment, input voltage Vin1 can be a direct current (DC) voltage provided by a battery or a power supply. Switch Q2 can be a P-type (e.g., P-channel) MOSFET arranged serially between switch node SW and ground. Driver circuit 130 can use control signals 126 to generate a drive signal 134 and use drive signal 134 to drive switch Q1, and to generate a drive signal 136 and use drive signal 136 to drive switch Q2. Driver circuit 130 can apply drive signals 134, 136 to gate terminals of switches Q1, Q2, alternately according to PWM control signals provided by controller 124. As a result of driving switches Q1, Q2 using drive signals 134, 136, an output voltage Vout_PH can be outputted from switch node SW. An inductor 140 having inductance L1 can be connected between switch node SW and output 144 of system 100. An output voltage Vout from output 144 can supply power to load 156. Load 156 can be, for example, a central processing unit (CPU), a multiprocessor unit (MPU), a computer, or other electronic components that requires power to operate.

Temperature sensors 148 can be configured to sense an ambient temperature of PMIC 102. If the ambient temperature of PMIC 102 is relatively high, such as being greater than a predefined temperature threshold (e.g., the die temperature is above 85° C., 185° F.), then temperature sensors 148 can output a flag (e.g., as an analog or digital signal) to controller 124. In response to receiving the flag, controller 124 can determine that PMIC 102 may be exposed to excessive heat and suspend or disable PMIC 102 to present damaging PMIC 102 and/or other components of system 100. Other temperature thresholds may be imposed, and the threshold may be adjusted based on various operating and environmental conditions of system 100.

Voltage sensing circuit 142 can be configured to receive a feedback of output voltage Vout from output 144. Voltage sensing circuit 142 can provide the feedback Vout to controller 124 and can output flags (e.g., analog or digital signals) to controller 124 indicating whether Vout is greater than, less than, or equal to, at least one predefined voltage thresholds. Controller 124 can use the flags from voltage sensing circuit 142 to operate various aspects of system 100.

Current sensing circuit 146 configured to receive a feedback of inductor current IL across inductors in system 100, such as an inductor 140 connected to an output 144 of system 100 or system 180. Current sensing circuit 146 can output flags (e.g., analog or digital signals) to controller 124 indicating whether the sensed inductor current is greater than, less than, or equal to, at least one predefined inductor current thresholds. Controller 124 can use the flags from current sensing circuit 146 to operate various aspects of system 100. In one embodiment, current sensing circuit 146 can be connected to inductors in system 100 using non-lossy connections, such as an inductive pickup sensor connection.

Host computer 104 can include a microcontroller or microcomputer having a processor 110 configured to read and execute computer instructions 112 (e.g., computer implemented code) stored on a non-transitory computer-readable medium 114 such as a read-only memory (ROM), a random access memory (RAM), a programmable logic device (PLD), a flash drive, a memory card/stick, a solid-state storage device, or the like which may be re-writable, removable, or replaceable to facilitate revision and/or update of computer instructions 112. Host computer 104 can communicate with controller 124 over a bidirectional bus 116.

In an aspect, current sensing circuit 146 can also provide the sensed inductor current IL to controller 124. Controller 124 can be configured to report the sensed inductor current IL to host processor 104 via bidirectional bus 116. The sensed inductor current IL from current sensing circuit 146 can be an analog signal such as alternating current (AC) signal. Controller 124 can be configured to convert the sensed inductor current IL into a digital signal 152 and report the digital signal 152 to host processor 104 as a digital signal (e.g., direct current (DC) signal). Note that a digital signal encoding a digital representation of current, or a number (or a digital value) that is exactly the load in amperes (e.g., if Imax=255 amperes, for an 8 bit ADC, the output of the ADC would be a number that represents the load in amperes) is being provided from controller 124 to host processor 104, instead of an analog current signal, due to host process 104 being a digital computing device. The digital signal 152 encoding the sensed inductor current IL can be a function of a system selected maximum current value. The maximum current value can be a parameter that is fixed for the system (e.g., system 100 or system 180) and this maximum current value can be programmable.

To generate a digital signal that is a function of the maximum current value, controllers in conventional power conversion systems can perform digital logic division to divide the sensed inductor current IL by the maximum current value Imax. The digital signal resulting from the digital logic division can be expressed in hexadecimal (e.g., maximum load can be reported as FF in hexadecimal). However, digital logic division can use a relatively large amount of silicon area and can be relatively slow and increases power consumption. To be described in more detail below, system 100 and/or system 180 can include a circuit 150. In the embodiment shown in FIG. 1A, circuit 150 can be connected between controller 124 and host processor 104. In the embodiment shown in FIG. 1B, circuit 150 can be integrated in PMIC 102 and can be connected between controller 124 and host processor 104. In one or more embodiments, circuit 150 can be a part of controller 124. Circuit 150 can be configured to use an analog-to-digital converter (ADC) to convert sensed inductor current IL into digital signal 152 without performing digital logic division. Circuit 150 can perform the conversion by scaling either the sensed inductor current IL or the maximum current value Imax, and the output of circuit 150 can be digital signal 152. By using circuit 150 to convert sensed inductor current IL into digital signal 152, controller 124 does not need to perform digital logic division. Without performing digital logic division, components needed for the digital logic division can be removed thus preserving silicon area. The direct conversion using an ADC in circuit 150 can also provide a relatively fast conversion from the sensed inductor current IL into digital signal 152 and consumes relatively less power when compared to conventional systems.

Figure 2:
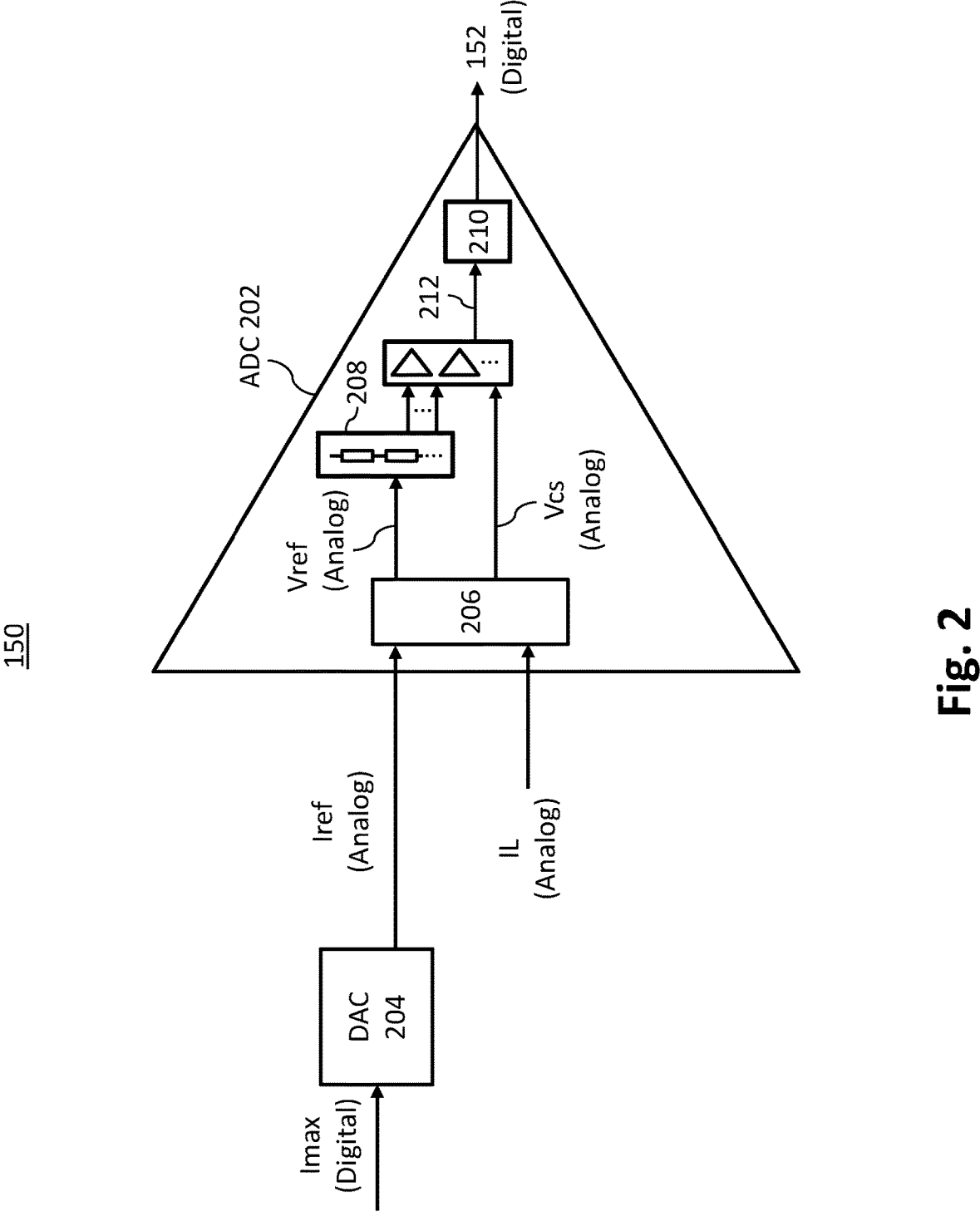
FIG. 2 illustrates an example circuit in accordance with sensed current scaling in power converters in one embodiment.

FIG. 2 illustrates an example circuit in accordance with sensed current scaling in power converters in one embodiment. Description of FIG. 2 can reference components shown in FIG. 1. In the embodiment shown in FIG. 2, circuit 150 can include an ADC 202 and a digital-to-analog converter (DAC) 204. ADC 202 can be configured to convert an analog signal into a digital signal. In the example embodiment shown in FIG. 2, ADC 202 can be a current-input ADC where the input signal being provided to ADC 202 can be a current signal having varying current levels. ADC 202 can include at least one current-to-voltage converters 206 to transform incoming current signals into equivalent voltage signals before performing analog to digital conversion. Each one of the current-to-voltage converters 206 can be implemented by a sense resistor, and voltage across the sense resistors can be the equivalent voltages of the current signals. In another embodiment, ADC 202 can be a voltage-input ADC and current-to-voltage converters 206 can be connected outside of ADC 202 and between the output of DAC 204 and the input of ADC 202 to convert current signals into voltage signals before ADC performs analog-to-digital conversion. DAC 204 can be configured to convert a digital signal representing a digital value into an analog signal that encodes the digital value. The digital signal being inputted to DAC 204 can be in the form of binary code or another digital representation. DAC 204 can be a current output DAC where the output of DAC 204 is an analog current signal having varying current levels.

In the embodiment shown in FIG. 2, DAC 204 in circuit 150 can receive a digital signal Imax that is a digital representation of a maximum current value of system 100 or system 180. In one embodiment, digital signal Imax can be provided to circuit 150 by host processor 104 via bidirectional bus 116. DAC 204 can convert Imax into an analog signal Iref, where Iref can be a reference current being provided to ADC 202. ADC 202 can receive reference current Iref and the sensed inductor current IL from current sensing circuit 146 and/or controller 124. If circuit 150 is external to controller 124, then the sensed inductor current IL can be received from controller 124. If circuit 150 is a part of controller 124, then the sensed inductor current IL can be received from current sensing circuit 146. Current-to-voltage converters 206 can convert Iref into a reference voltage Vref, and can convert the sensed inductor current IL into a current sense voltage Vcs. Reference voltage Vref and current sense voltage Vcs can be analog voltage signals.

Reference voltage Vref can be provided to a plurality of resistors 208 connected in series ("series resistors 208") in ADC 202. Series resistors 208 can divide the reference voltage Vref into multiple discrete voltages. Each discrete voltage can be provided to a comparator among a plurality of comparators 210 in ADC 202. Current sense voltage Vcs can be provided to each one of the comparators among comparators 210 to be compared with each discrete voltage. Outputs of the comparators 210 can be provided to a decoder 212 in ADC 202. Comparators 210 can generate binary outputs, such as either a low voltage (e.g., 0V or a low voltage representing logic zero) or a high voltage (e.g., high voltage representing logic one). Among the outputs of the comparators 210, one of the comparators 210 can output a signal indicating a match of current sense voltage Vcs with one of the discrete voltages. Decoder 212 can receive the outputs of the comparators 210 and produce an output, which can be digital signal 152, that corresponds to the combination of the outputs of the comparators 210.

By way of example, decoder 212 can be a binary-to-decimal decoder that takes a binary input and produces a decimal output, where different combinations of the input bits to the decoder 212 can correspond to a specific decimal output. Using an example where Vref is 1.28 volt (V), if ADC 202 is an 8-bit ADC, series resistors 208 can divide 1.28V into 256 discrete voltages ranging from 0V to 1.28V. The 256 discrete voltages can be provided to 256 comparators among comparators 210. Current sense voltage Vcs can also be provided to the 256 comparators to be compared with the 256 discrete voltages. If current sense voltage Vcs is 0.32V, then one of the comparator among comparators 210 comparing Vcs=0.32V can output, for example, a binary high signal such as a nonzero voltage representing binary one. The rest of the comparators among comparators 210 can output a binary low signal such as 0V. In one embodiment, inverters can be connected to outputs of comparators 210 such that a comparator can output 0V when there is a match. A corresponding inverter can convert the 0V to high voltage representing binary one while the rest of the comparators among comparators 210 can output high voltages and the corresponding inverters can convert the high voltages to 0V. Decoder 212 can receive the outputs from comparators 210 as a binary value, such as 1000000, where this binary value can correspond to decimal value of '64'.

Circuit 150 can output digital signal 152 that can be a DAC code representing the decimal value of '64' to host processor 104. If host processor 104 requires a hexadecimal value, circuit 150 can include a digital circuit, such as a digital to hexadecimal converter, to convert the output from decoder 212 into a hexadecimal value and output the hexadecimal value as digital signal 152. For example, the digital to hexadecimal converter can convert the decimal value '64' into a hexadecimal value '40'. The decimal value of '64' is equivalent to 0.32/1.28, hence effectively scaling Vref by dividing Vcs by Vref. Therefore, the output of a DAC code representing decimal '64' can be a function of the maximum current value Imax (e.g., digital value 152=IL/Imax). By using ADC 202 and DAC 204 in circuit 150 to divide IL by Imax, digital logic circuits for performing digital logic division may not be needed in system 100 or system 180 and silicon area can be preserved. The direct conversion using circuit 150 can also provide a relatively fast conversion from IL into digital signal 152 and consumes relatively less power when compared to using digital logic circuits to perform digital logic division. Further, for the embodiment shown in FIG. 2, ADC 202 can operate using an external reference voltage Iref such that when the maximum current Imax changes, other parts of circuit 150 does not need to be changed.

Figure 3:
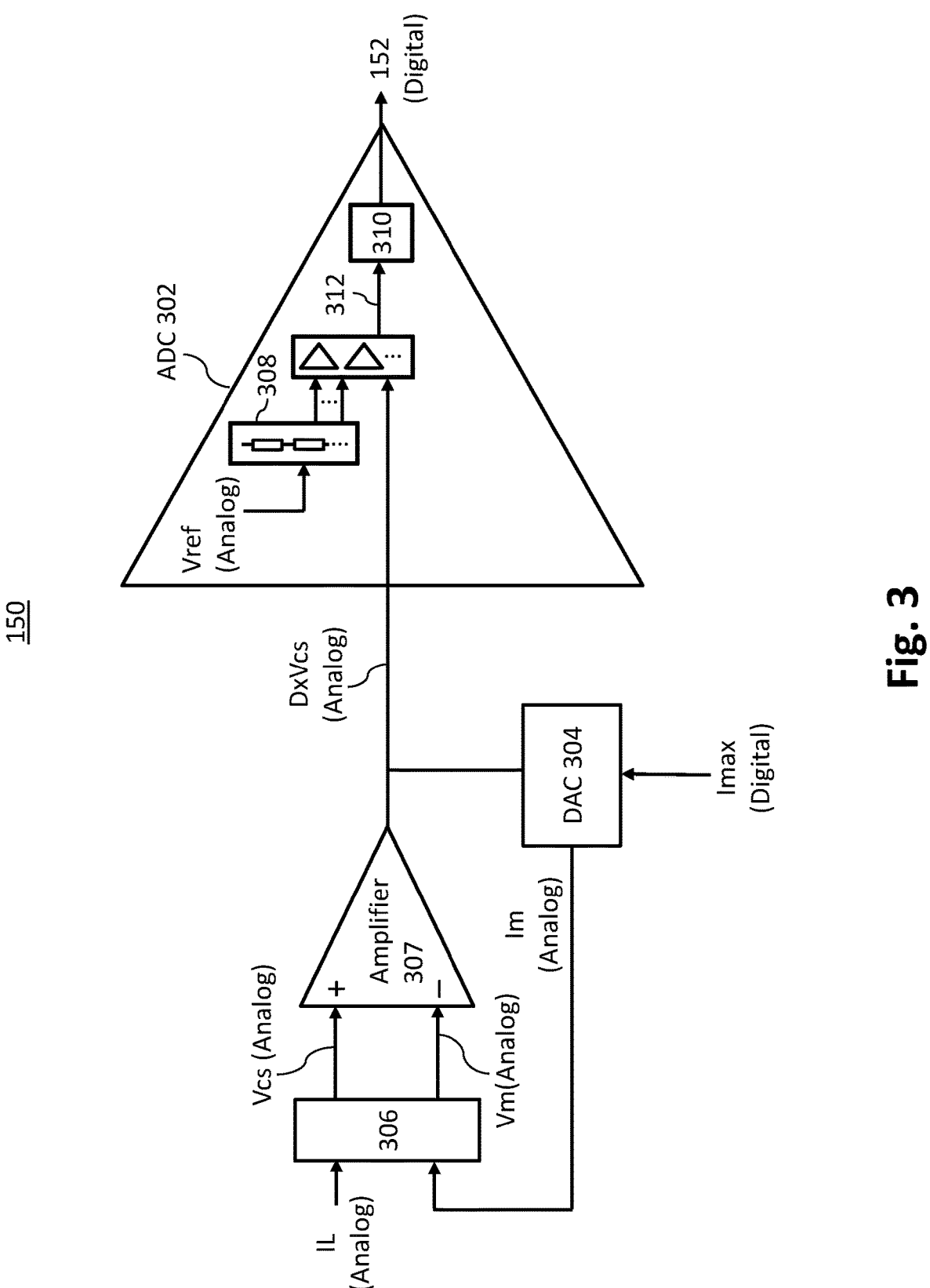
FIG. 3 illustrates another example circuit in accordance with sensed current scaling in power converters in one embodiment.

FIG. 3 illustrates another example circuit in accordance with sensed current scaling in power converters in one embodiment. Description of FIG. 3 can reference components shown in FIG. 1 to FIG. 2. In the embodiment shown in FIG. 3, circuit 150 can include an ADC 302, a DAC 304 and an amplifier 307. ADC 302 can be configured to convert an analog signal into a digital signal. In the example embodiment shown in FIG. 3, ADC 302 can be a voltage-input ADC where the input signal being provided to ADC 302 can be an analog voltage signal. Further, ADC 302 can be a single-input ADC with an internal reference voltage Vref that is generated internally within ADC 302. The internal reference voltage in ADC 302 can be fixed. DAC 304 can be configured to convert a digital signal representing a digital value into an analog signal that encodes the digital value. The digital signal being inputted to DAC 304 can be in the form of binary code or another digital representation. DAC 304 can be a current output DAC where the output of DAC 304 is an analog current signal having varying current levels. Current-to-voltage converters 306 can be configured to transform incoming current signals into equivalent voltage signals. Each one of the current-to-voltage converters 306 can be implemented by a sense resistor, and voltage across the sense resistors can be the equivalent voltages of the current signals.

Amplifier 307 can be a differential amplifier that can receive a first input analog voltage signal at a non-inverting input terminal ("+" positive input terminal) and can receive a second input analog voltage signal at an inverting input terminal ("−" negative input terminal). Amplifier 307 can amplify and/or output a difference between the first input and the second input, where the difference is equivalent to the first input subtract the second input. If the first input is less than the second input, then amplifier 307 can output a negative voltage. If the first input is greater than the second input, then amplifier 307 can output a positive voltage.

In the embodiment shown in FIG. 3, DAC 304 in circuit 150 can receive a digital signal Imax that is a digital representation of a maximum current value of system 100 or system 180. In one embodiment, digital signal Imax can be provided to circuit 150 by host processor 104 via bidirectional bus 116. DAC 304 can convert Imax into an analog signal Im can be a current signal with varying current levels. DAC 304 can output Im to current-to-voltage converters 306. The sensed inductor current IL can also be provided to current-to-voltage converters 306. Current-to-voltage converters 306 can convert the analog signal Im into an analog voltage signal Vm that has varying voltage level, and can convert the sensed inductor current IL into an analog voltage signal Vcs that has varying voltage level. Vcs can be applied on the non-inverting input of amplifier 307 and Vm can be applied on the inverting input of amplifier 307.

By way of example, a combination of DAC 304 and amplifier 307 can implement a variable gain amplifier. A variable gain controller can generate an output that is a scaled version of the input voltage, and the scaling factor can be based on a variable gain. The combination of DAC 304 and amplifier 307 can allow a DAC code representing Imax to be the gain since Imax can be variable, thus Imax can be applied as the variable gain. The input to the amplifier 307 is the sensed inductor current IL, thus the voltage Vcs converted from IL can be the input voltage to be scaled. In the embodiment shown in FIG. 3, the output of the combination of DAC 304 and amplifier 307 can be DxVcs, where D=(total number of DAC code)/(total number of DAC code−DAC code), where the DAC code is the digital representation of Imax. Therefore, the variable D can be a scaling factor and the scaled voltage DxVcs can be provided to ADC 302. Also, the scaling factor D is greater than or equal to 1. By using ADC 302, DAC 304 and amplifier 307 in circuit 150 to divide IL by Imax, digital logic circuits for performing digital logic division may not be needed in system 100 or system 180 and silicon area can be preserved. Further, for the embodiment shown in FIG. 3, an ADC with fixed internal reference voltage, such as ADC 302, can be used for implementing circuit 150 while allowing Imax to be changed using DAC 304.

Figure 4:
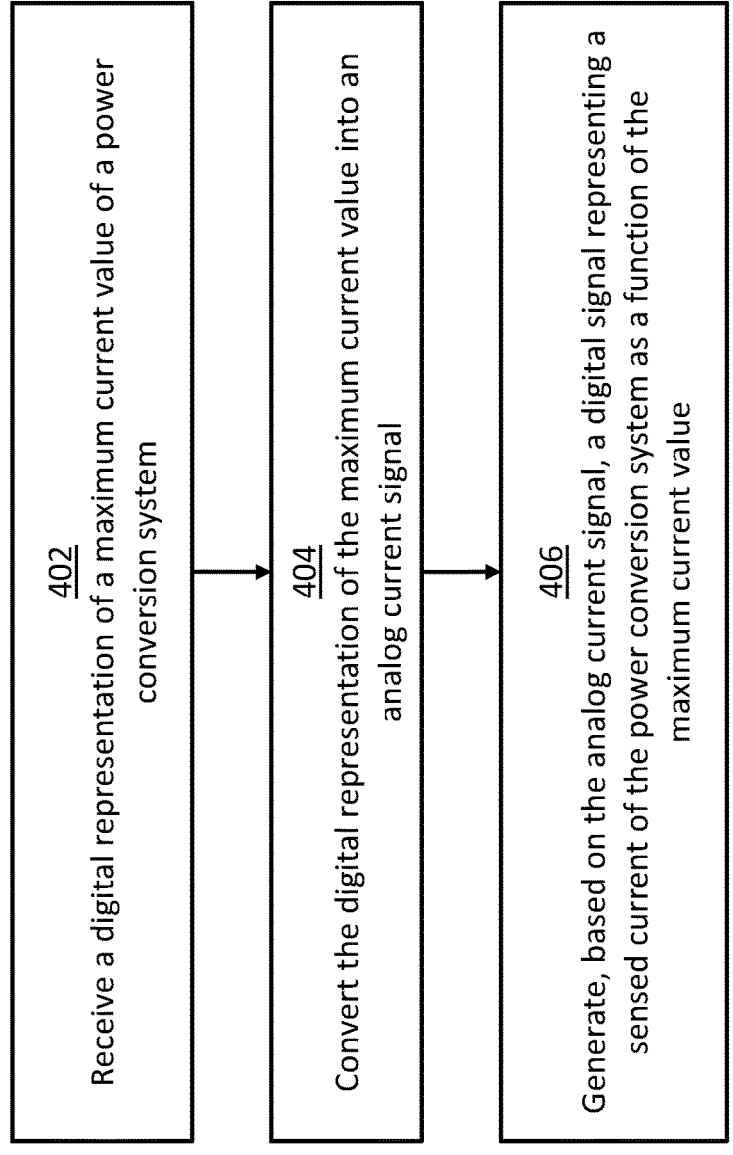
FIG. 4 is a flow diagram illustrating a process to implement sensed current scaling in power converters in one embodiment.

FIG. 4 is a flow diagram illustrating a process 400 to implement sensed current scaling in one embodiment. The process can include one or more operations, actions, or functions as illustrated by one or more of blocks 402, 404 and/or 406 shown in FIG. 4. Although illustrated as discrete blocks, various blocks can be divided into additional blocks, combined into fewer blocks, eliminated, performed in different order, or performed in parallel, depending on the desired implementation.

Process 400 can be performed by a circuit in a power conversion system, such as circuit 150 of system 100 or system 180 described herein. Process 400 can begin at block 402. At block 402, the circuit can receive a digital representation of a maximum current value of a power conversion system. Process 400 can proceed from block 402 to block 404. At block 404, the circuit can convert the digital representation of the maximum current value into an analog current signal. In one embodiment, the maximum current value can be adjustable. Process 400 can proceed from block 404 to block 406. At block 406, the circuit can generate, based on the analog current signal, a digital signal representing a sensed current of the power conversion system as a function of the maximum current value. In one embodiment, the digital signal can be a DAC code.

In one embodiment, the circuit can convert the analog current signal into a reference voltage of an analog-to-digital converter (ADC), convert the sensed current into a current sense voltage, and operate the ADC to divide the current sense voltage by the reference voltage to generate the digital signal.

In one embodiment, the circuit can convert the analog current signal into a voltage signal and convert the sensed current into a current sense voltage. The circuit can further receive the voltage signal and the current sense voltage. The circuit can scale the current sense voltage based on the voltage signal and provide the scaled current sense voltage as an input voltage to an ADC. The circuit can operate the ADC to divide the scaled current sense voltage by an internal reference voltage of the ADC to generate the digital signal. In one embodiment, scaling the current sense voltage can include operating a digital-to-analog converter (DAC) in combination with an amplifier to implement a variable gain amplifier.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes", "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The various embodiments were chosen and described in order to best explain the principles of the invention and the practical application, and to enable others of ordinary skill in the art to understand the invention for various embodiments with various modifications as are suited to the particular use contemplated.

What is claimed is:

1. A semiconductor device comprising:
a digital to analog converter (DAC) configured to:
 receive a digital representation of a maximum current value of a power conversion system; and
 convert the digital representation of the maximum current value into an analog current signal; and
an analog to digital converter (ADC) configured to generate, based on the analog current signal, a digital signal representing a sensed current of an inductor connected to an output of a power stage in the power conversion system as a function of the maximum current value.

2. The semiconductor device of claim 1, further comprising a current-to-voltage converter configured to:

convert the analog current signal into a reference voltage of the ADC; and convert the sensed current into a current sense voltage, wherein the ADC is configured to divide the current sense voltage by the reference voltage to generate the digital signal.

3. The semiconductor device of claim 1, further comprising:

a current-to-voltage converter configured to:

convert the analog current signal into a voltage signal; and convert the sensed current into a current sense voltage; and an amplifier configured to:

receive the voltage signal and the current sense voltage;

scale the current sense voltage based on the voltage signal; and provide the scaled current sense voltage as an input voltage to the ADC, wherein the ADC is configured to divide the scaled current sense voltage by an internal reference voltage of the ADC to generate the digital signal.

4. The semiconductor device of claim 3, wherein the DAC and the amplifier implements a variable gain amplifier.

5. The semiconductor device of claim 1, wherein the maximum current value is adjustable.

6. The semiconductor device of claim 1, wherein the power conversion system is a single phase power conversion system.

7. The semiconductor device of claim 1, wherein the power conversion system is a multiphase power conversion system.

8. A system comprising:

at least one power stage;

a controller configured to control the power stage; and a circuit comprising:

a digital to analog converter (DAC) configured to:

receive a digital representation of a maximum current value of the system; and convert the digital representation of the maximum current value into an analog current signal; and an analog to digital converter (ADC) configured to generate, based on the analog current signal, a digital signal representing a sensed current of an inductor connected to an output of the power stage as a function of the maximum current value, wherein the controller is configured to report the digital signal to a host processor.

9. The system of claim 8, wherein the circuit further comprises a current-to-voltage converter configured to:

convert the analog current signal into a reference voltage of the ADC; and convert the sensed current into a current sense voltage, wherein the ADC is configured to divide the current sense voltage by the reference voltage to generate the digital signal.

10. The system of claim 8, wherein the circuit further comprises:

a current-to-voltage converter configured to:

convert the analog current signal into a voltage signal; and convert the sensed current into a current sense voltage; and an amplifier configured to:

receive the voltage signal and the current sense voltage;

scale the current sense voltage based on the voltage signal; and provide the scaled current sense voltage as an input voltage to the ADC, wherein the ADC is configured to divide the scaled current sense voltage by an internal reference voltage of the ADC to generate the digital signal.

11. The system of claim 10, wherein the DAC and the amplifier implements a variable gain amplifier.

12. The system of claim 8, wherein the maximum current value is adjustable.

13. The system of claim 8, wherein the at least one power stage comprises one power stage.

14. The system of claim 8, wherein the at least one power stage comprises more than one power stage.

15. A method comprising:

receiving a digital representation of a maximum current value of a power conversion system;

converting the digital representation of the maximum current value into an analog current signal; and generating, based on the analog current signal, a digital signal representing a sensed current of an inductor connected to an output of a power stage in the power conversion system as a function of the maximum current value.

16. The method of claim 15, further comprising:

converting the analog current signal into a reference voltage of an analog-to-digital converter (ADC);

converting the sensed current into a current sense voltage; and operating the ADC to divide the current sense voltage by the reference voltage to generate the digital signal.

17. The method of claim 15, further comprising:

converting the analog current signal into a voltage signal;

converting the sensed current into a current sense voltage;

receiving the voltage signal and the current sense voltage;

scaling the current sense voltage based on the voltage signal;

providing the scaled current sense voltage as an input voltage to an ADC; and performing an ADC operation to divide the scaled current sense voltage by an internal reference voltage of the ADC to generate the digital signal.

18. The method of claim 17, wherein scaling the current sense voltage comprises operating a digital-to-analog converter (DAC) in combination with an amplifier to implement a variable gain amplifier.

19. The method of claim 15, wherein the maximum current value is adjustable.

20. The method of claim 15, wherein the digital signal is a DAC code.

* * * * *